US008304803B2

(12) United States Patent
Tanaka et al.

(10) Patent No.: US 8,304,803 B2
(45) Date of Patent: Nov. 6, 2012

(54) LIGHT-EMITTING DIODE

(75) Inventors: Hiroyuki Tanaka, Kyoto (JP); Nobuaki Nagao, Gifu (JP); Takahiro Hamada, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/283,985

(22) Filed: Oct. 28, 2011

(65) Prior Publication Data

US 2012/0104354 A1    May 3, 2012

Related U.S. Application Data

(63) Continuation of application No. PCT/JP2011/002243, filed on Apr. 15, 2011.

(30) Foreign Application Priority Data

Apr. 20, 2010  (JP) .................................. 2010-096792

(51) Int. Cl.
*H01L 21/00* (2006.01)

(52) U.S. Cl. .............. 257/99; 257/95; 257/98; 257/103; 257/E21.463; 257/E33.008; 257/E33.059; 257/E33.061; 257/E33.064

(58) Field of Classification Search .................. 257/81, 257/95–103, 438, E21.463, E33.008
See application file for complete search history.

(56) References Cited

U.S. PATENT DOCUMENTS

| 6,982,438 | B2 * | 1/2006 | Ishizaki .................. 257/103 |
| 7,372,081 | B2 * | 5/2008 | Song et al. .............. 257/99 |
| 8,017,932 | B2 * | 9/2011 | Okamoto et al. .......... 257/13 |
| 2004/0235212 | A1 * | 11/2004 | Ishizaki ................. 438/46 |
| 2005/0139825 | A1 * | 6/2005 | Song et al. .............. 257/44 |
| 2005/0156496 | A1 * | 7/2005 | Takashima et al. ....... 313/237 |
| 2006/0091405 | A1 | 5/2006 | Kwak |

(Continued)

FOREIGN PATENT DOCUMENTS

JP     2001-144323     5/2001

(Continued)

OTHER PUBLICATIONS

S. Nakamura et al., "Superbright Green InGaN Single-Quantam-Well-Structure Light-Emitting Diodes," Jpn. J. Appl. Phys. vol. 34 (1995), L-1332-L1335.

(Continued)

*Primary Examiner* — Michael Lebentritt
(74) *Attorney, Agent, or Firm* — McDermott Will & Emery LLP

(57) ABSTRACT

A light-emitting diode includes an n-type nitride semiconductor layer, a multiple quantum well, a p-type nitride semiconductor layer, a window electrode layer, a p-side electrode, and an n-side electrode, which are stacked in this order. The window electrode layer comprises an n-type single-crystalline ITO transparent film and an n-type single-crystalline ZnO transparent film. The p-type nitride semiconductor layer is in contact with the n-type single-crystalline ITO transparent film, the n-type single-crystalline ITO transparent film is in contact with the n-type single-crystalline ZnO transparent film, and the p-side electrode is in connected with the n-type single-crystalline ZnO transparent film. The n-type single-crystalline ITO transparent film contains Ga, a molar ratio of Ga/(In+Ga) being not less than 0.08 and not more than 0.5. Thickness of the n-type single-crystalline ITO transparent film is not less than 1.1 nm and not more than 55 nm.

2 Claims, 12 Drawing Sheets

U.S. PATENT DOCUMENTS

| | | | |
|---|---|---|---|
| 2006/0267042 A1* | 11/2006 | Izuno et al. | 257/100 |
| 2008/0145962 A1* | 6/2008 | Song et al. | 438/29 |
| 2009/0283782 A1* | 11/2009 | Shakuda | 257/94 |
| 2010/0096615 A1* | 4/2010 | Okamoto et al. | 257/13 |
| 2010/0296024 A1* | 11/2010 | Ishimaru et al. | 349/61 |
| 2010/0320450 A1 | 12/2010 | Fujioka | |
| 2011/0062485 A1 | 3/2011 | Nakayama et al. | |
| 2011/0079800 A1* | 4/2011 | Konno | 257/95 |
| 2011/0316037 A1* | 12/2011 | Kamei et al. | 257/99 |

FOREIGN PATENT DOCUMENTS

| | | |
|---|---|---|
| JP | 2005-191326 | 7/2005 |
| JP | 2006-128631 | 5/2006 |
| JP | 2006-179618 | 7/2006 |
| WO | WO 2009/110539 | 9/2009 |

OTHER PUBLICATIONS

Kow-Ming Chang et al., "Investigation of indium-tin-oxide ohmic contact to p-GaN and its application to high-brightness GaN-based light-emitting diodes," Solid-State Electronics 49 (2005), pp. 1381-1386.

Chun-Ju Tun et al., "Enhanced Light Output of GaN-Based Power LEDs With Transparent Al-Doped ZnO Current Spreading Layer," IEEE Photonics Technology Letters, vol. 18, No. 1, Jan. 1, 2006.

Y. Hua et al., "Light extraction efficiency enhancement of GaN-based light-emitting diodes by a ZnO current spreading layer," Journal of Semiconductors, vol. 30, No. 9, Sep. 2009.

* cited by examiner

LIGHT-EMITTING DIODE

RELATED APPLICATIONS

This application is a continuation of PCT International Application PCT/JP2011/002243 filed on Apr. 15, 2011, which claims priority to Japanese Patent Application No. 2010-096792 filed on Apr. 20, 2010. The disclosures of these applications including the specifications, the drawings, and the claims are hereby incorporated by reference in their entirety.

TECHNICAL FIELD

The present disclosure relates to a light-emitting diode composed of a nitride semiconductor. Particularly, the present invention relates to a light-emitting diode characterized by a window electrode layer.

BACKGROUND ART

A light-emitting diode composed of aluminum nitride (AlN), gallium nitride (GaN), indium nitride (InN), or a mix crystal thereof emits light in a wide wavelength region from ultraviolet to infrared by adjusting the composition of the film included in the light-emitting diode. Non-patent Document 1 discloses a commercially-available light-emitting diode which emits visible light.

FIG. 9 shows a cross-sectional view of the light-emitting diode composed of a nitride semiconductor disclosed in Patent Document 1.

As shown in FIG. 9, the light-emitting diode comprises a low-temperature growth buffer layer 92 consisted of GaN, an n-type GaN cladding layer 93, a multi-quantum well layer 94, a p-type GaN cladding layer 95, a window electrode layer 96, and a p-side electrode 97 on a sapphire substrate 91 having a surface direction of (0001) in this order.

The window electrode layer 96 comprises both of a function of diffusing current extensively and a function of transparence for extracting light outside. An example of the material of the window electrode layer 96 is tin-doped indium oxide (ITO). An n-side electrode 98 is formed on the n-type GaN cladding layer 93.

Patent Documents 2 and 3 disclose a light-emitting diode composed of a nitride semiconductor.

CITATION LISTS

Patent Document

[Patent Document 1] Japanese Laid-open patent publication No. 2009-200207.
[Patent Document 2] Japanese Laid-open patent publication No. 2006-179618 (Particularly, paragraph [0020])
[Patent Document 3] Japanese Laid-open patent publication No. 2005-191326 (Particularly, paragraph [0056])

Non-Patent Document

[Non-Patent Document 1] Shuji Nakamura et. al., Jpn. J. AppL Phys. Vol. 34 (1995) L. 1332-L. 1335
[Non-Patent Document 2] Kow-Ming Chang et. al., Solid-State Electronics 49 (2005) 1381-1386
[Non-Patent Document 3] Chun-Ju Tun et. al., IEEE Photon. Technol. Lett., vol. 18, (2006) 274-276
[Non-Patent Document 4] Yang Hua et. al., Journal of Semiconductors vol. 30 (2009) 094002-1-4

SUMMARY OF THE INVENTION

Technical Problem

An ITO formed on GaN in a normal manner is polycrystalline. Light is easy to be scattered due to crystal grain boundaries in the polycrystalline structure. This causes efficiency of light extraction to be lowered.

Non-Patent Documents 3 and 4 disclose that a window electrode layer composed of zinc oxide (ZnO) has higher efficiency of light extraction than the ITO. The reason is that single-crystalline ZnO can be grown on a p-type GaN layer. Needless to say, since a single-crystal does not have crystal grain boundaries, it does not scatter light.

However, the depth of the work function of ZnO is relatively lower, compared to the energy level of the valence bond edge of p-type GaN. For this reason, the ZnO which is in contact with the p-type GaN has high contact resistance.

Namely, there is a collision between the improvement of the efficiency of the light extraction from the window electrode layer and the decrease of the contact resistance of the window electrode layer contacting the p-type GaN.

The purpose of the present invention is to provide a light-emitting diode which achieves simultaneously the improvement of the efficiency of the light extraction from the window electrode layer and the decrease of the contact resistance of the window electrode layer contacting the p-type GaN.

Solution to Problem

The present disclosure relates to a light-emitting diode comprising an n-type nitride semiconductor layer, a multiple quantum well, a p-type nitride semiconductor layer, a window electrode layer, a p-side electrode, and an n-side electrode. The n-type nitride semiconductor layer, the multiple quantum well, the p-type nitride semiconductor layer, the window electrode layer, the p-side electrode, and the n-side electrode are stacked in this order. The n-side electrode is electrically connected to the n-type nitride semiconductor layer. The window electrode layer comprises an n-type single-crystalline ITO transparent film and an n-type single-crystalline ZnO transparent film. The p-type nitride semiconductor layer is in contact with the n-type single-crystalline ITO transparent film, the n-type single-crystalline ITO transparent film is in contact with the n-type single-crystalline ZnO transparent film, and the p-side electrode is in connected with the n-type single-crystalline ZnO transparent film. The n-type single-crystalline ITO transparent film contains not only In but also Ga, and the n-type single-crystalline ITO transparent film has a molar ratio of Ga/(In+Ga) of not less than 0.08 and not more than 0.5. The n-type single-crystalline ITO transparent film has a thickness of not less than 1.1 nm and not more than 55 nm.

The present disclosure also relates to a method for emitting a light from a light-emitting diode of the present invention comprises the following step (a) and step (b). The step (a) is a step of preparing the light-emitting diode of the above-mentioned composition, and the step (b) is a step of applying a potential difference between the n-side electrode and the p-side electrode to emit a light from the light-emitting diode.

The present disclosure further relates to a method of manufacturing a light-emitting diode. The method includes steps of forming an n-type nitride semiconductor layer on a substrate, forming a multiple quantum well layer on the n-type nitride semiconductor layer, forming a p-type nitride semiconductor layer on the multiple quantum well layer, forming an ITO film on the p-type nitride semiconductor layer, forming a ZnO film on the ITO film, and forming a p-side electrode on the ZnO film. The ITO may be formed by a pulsed laser deposition method. In the pulsed laser deposition, a Ga-doped ITO target may be utilized. The ZnO film may be formed by a pulsed laser deposition method.

Advantageous Effect of the Invention

The light-emitting diode of the present invention achieves simultaneously the improvement of the efficiency of the light extraction from the window electrode layer and the decrease of the contact resistance of the window electrode layer contacting the p-type GaN.

DESCRIPTION OF EMBODIMENTS

An exemplary embodiment of the present invention is described below with reference to the drawings.

Embodiment 1

Figure 1:
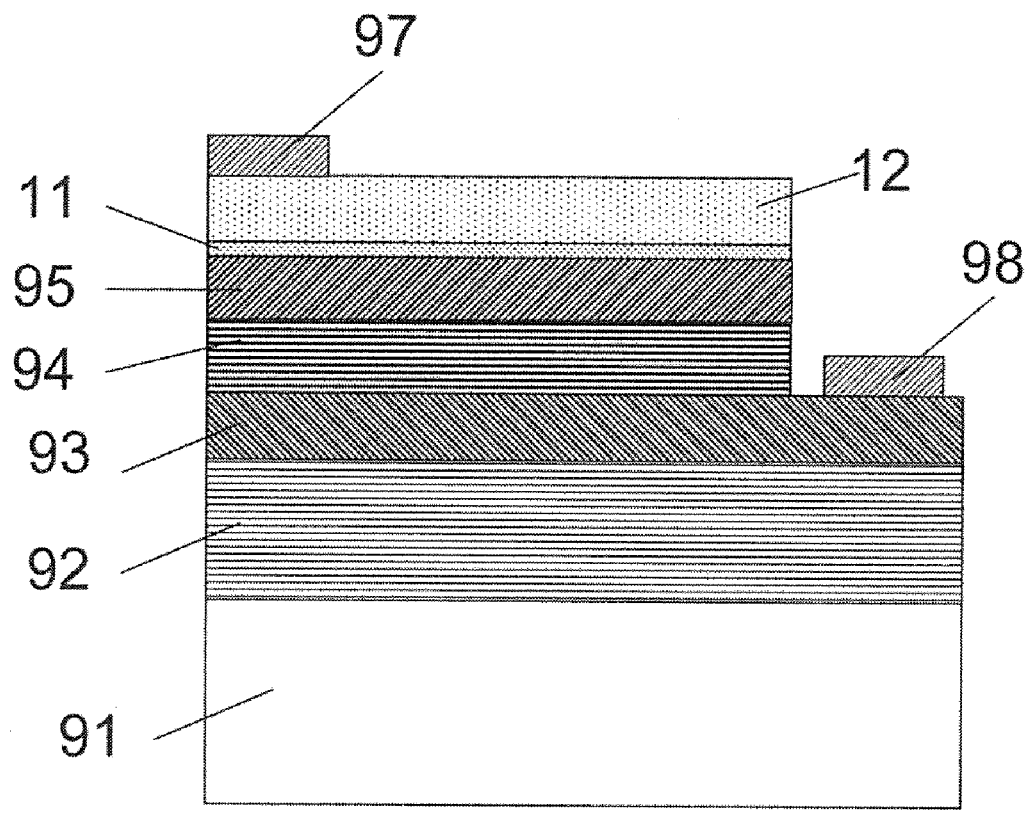
FIG. 1 shows an exemplary cross-sectional view of the light-emitting diode according to embodiment 1.
Figure 9:
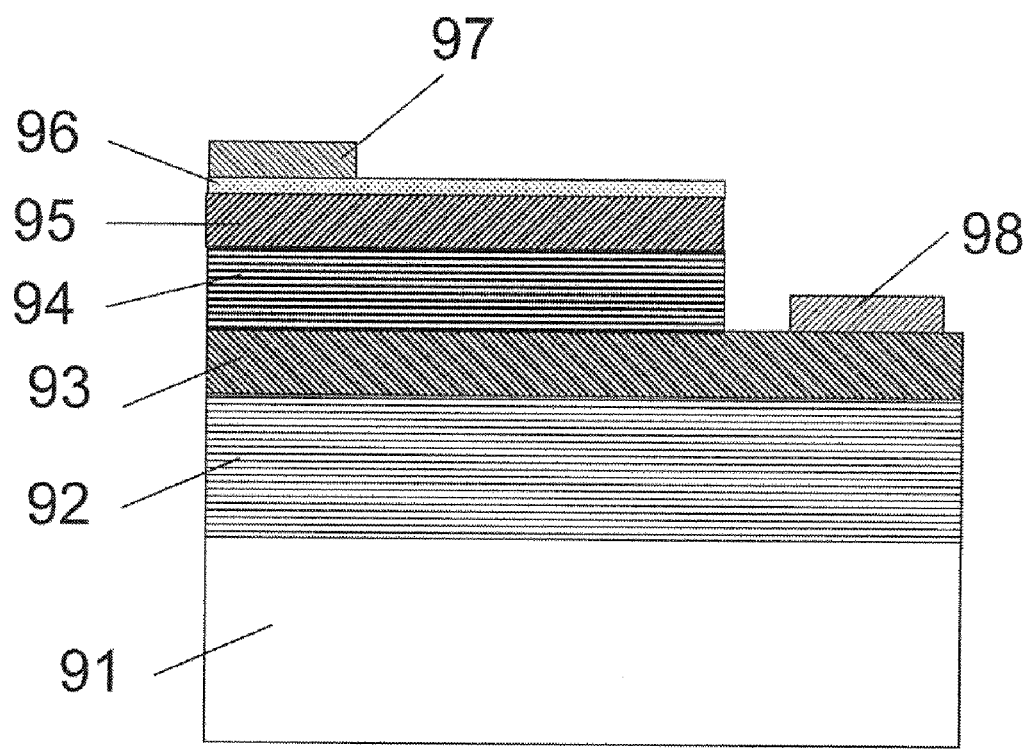
FIG. 9 shows a cross-sectional view of a prior light-emitting diode.

FIG. 1 shows a cross-sectional view of the light-emitting diode according to embodiment 1. When an element shown in FIG. 1 is identical to the element shown in FIG. 9, the identical reference mark is used to omit the description thereof.

The window electrode layer according to the embodiment 1 is composed of a Ga-doped single-crystalline ITO transparent electrode film 11 and an n-type single-crystalline ZnO transparent electrode film 12. A p-side electrode 97 is formed on the n-type single-crystalline ZnO transparent electrode film 12. An example of the p-side electrode 97 is a bilayer film composed of titanium (Ti) and aluminum (Al). An example of the n-side electrode 98 is a bilayer of titanium (Ti) and aluminum (Al).

FIGS. 2A to 3B show a method for fabricating the light-emitting diode according to the embodiment 1.

An MOCVD method is used as a crystal growth method of a group-III nitride semiconductor. An example of the source of gallium is trimethylgallium (TMG). An example of the source of aluminum is trimethylaluminum (TMA). An example of the source of indium is trimethylindium (TMI). An example of the source of nitride is ammonia ($NH_3$). An example of the material of an n-type dopant is silane ($SiH_4$). An example of the material of a p-type dopant is cyclopentadienylmagnesium ($CP_2Mg$).

Figure 2A:
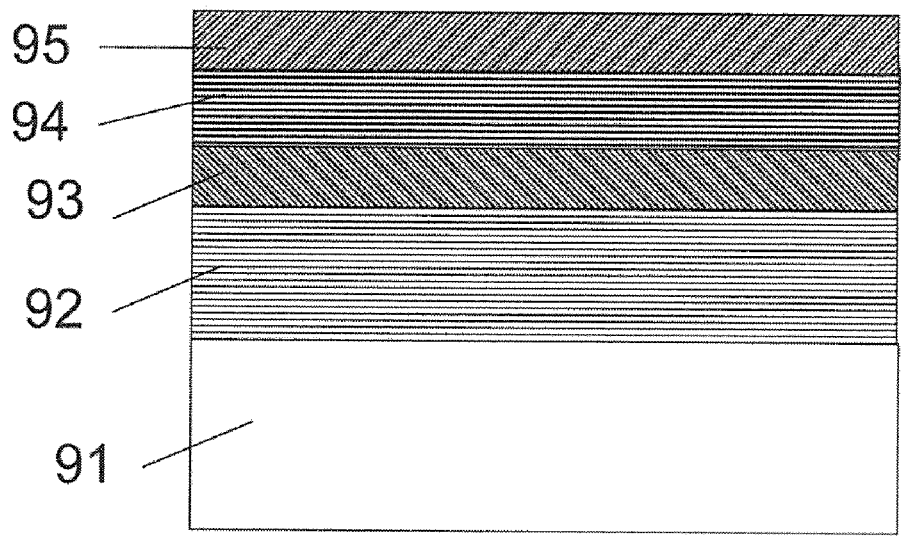
FIG. 2A shows an exemplary cross-sectional view of the fabricating method of the light-emitting diode according to embodiment 1.

As shown in FIG. 2A, a GaN low-temperature buffer layer 92 is grown on a sapphire substrate 91 having a main surface of a (0001) surface by a low-temperature MOCVD at a temperature of approximately 500 degree Celsius. Subsequently, an n-type cladding layer 93 composed of n-type GaN, a multi-quantum well layer 94, and a p-type cladding layer 95 composed of p-type GaN are formed in this order by an MOCVD method at a temperature of approximately 900 degree Celsius. An example of the multi-quantum well layer 94 is a multilayer formed by stacking $In_xGa_{1-x}N$ and GaN alternately.

Figure 2B:
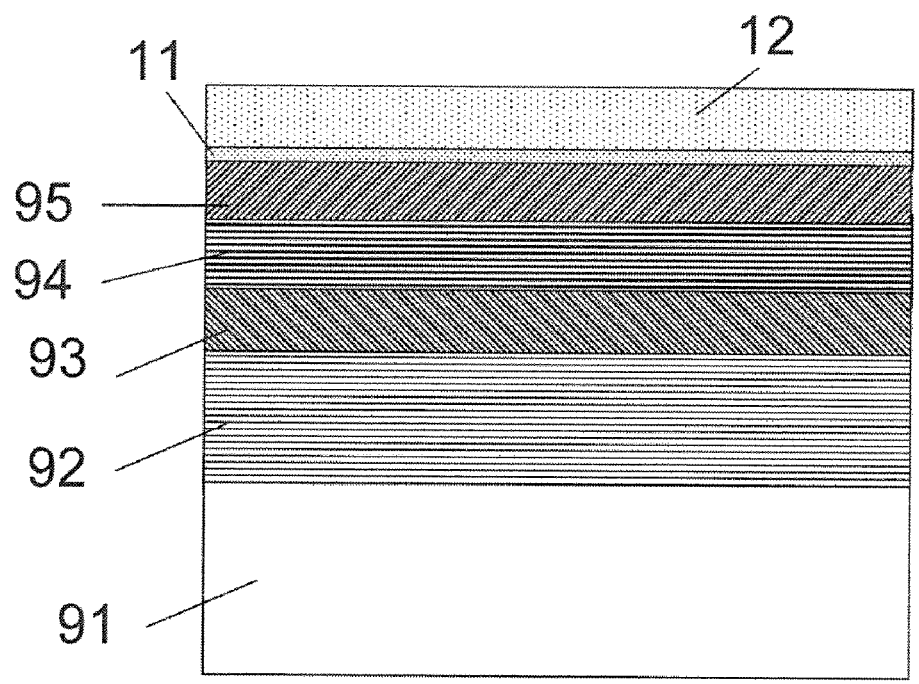
FIG. 2B shows an exemplary cross-sectional view of the fabricating method of the light-emitting diode according to embodiment 1.

Next, as shown in FIG. 2B, the window electrode layer is formed.

The single-crystalline ITO transparent electrode film 11 contains not only In but also Ga. The molar ratio of Ga/(Ga+In) in the single-crystalline ITO transparent electrode film 11 is not less than 0.08 and not more than 0.5. The molar ratio of Ga/(Ga+In) of less than 0.08 causes the ITO transparent electrode film 11 to be polycrystalline. The molar ratio of Ga/(Ga+In) of more than 0.5 causes the crystallinity of the ITO transparent electrode film 11 to be lowered.

The single-crystalline ITO transparent electrode film 11 has a thickness of not less than 1.1 nanometers and not more than 55 nanometers. The thickness of less than 1.1 nanometers causes the contact resistance to be increased. The thickness of more than 55 nanometers causes the n-type ITO transparent electrode film 11 to be polycrystalline.

The single-crystalline ITO transparent electrode film 11 may be grown by a pulsed laser deposition method (a PLD method). More particularly, a gallium (Ga)-doped ITO target and the sapphire substrate 91 comprising the p-type cladding layer 95 are disposed parallel. An excimer laser with a wavelength of 248 nanometers is irradiated obliquely on the ITO target. In this manner, the crystalline ITO transparent electrode film 11 is formed on the p-type cladding layer 95 through the ablation of the ITO target.

An example of atmospheric pressure in the PLD method is not more than $1 \times 10^{-3}$ Pa. An example of temperature of the sapphire substrate 91 is approximately 250 degrees Celsius.

The n-type single-crystalline ZnO transparent electrode film 12 is subsequently grown on the single-crystalline ITO transparent electrode film 11.

Similarly to the case of the single-crystalline ITO transparent electrode film 11, the n-type single-crystalline ZnO transparent electrode film 12 is grown by the PLD method with use of the ZnO target. An example of partial pressure of oxygen gas in the PLD method is $2 \times 10^{-1}$ Pa. An example of temperature of the sapphire substrate 91 in the PLD method is 400 degree Celsius.

The n-type single crystalline ZnO transparent electrode film 12 may contain Al or Ga. The n-type single-crystalline ZnO transparent electrode film 12 containing Al or Ga is formed by a PLD method with use of the ZnO target containing Al or Ga.

Figure 3A:
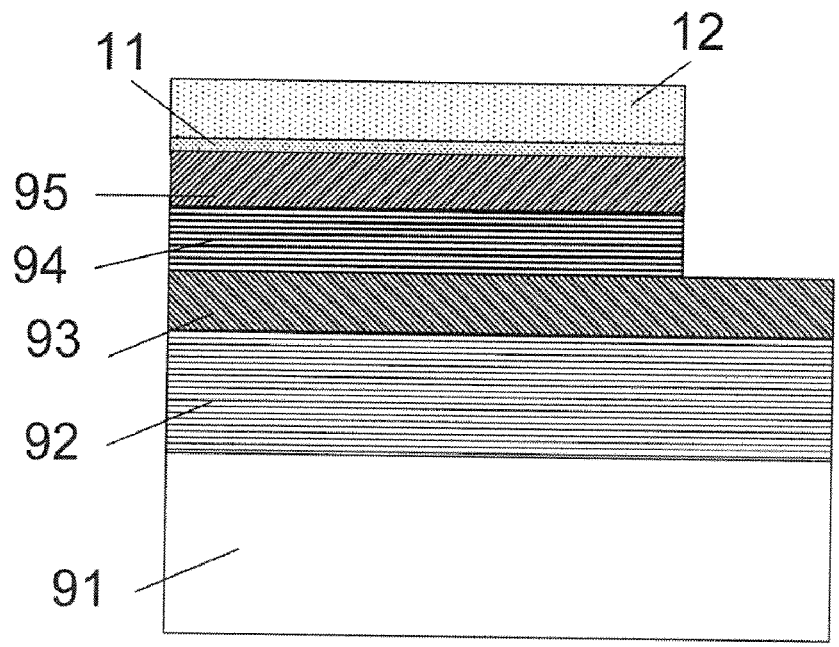
FIG. 3A shows an exemplary cross-sectional view of the fabricating method of the light-emitting diode according to embodiment 1.
Figure 3B:
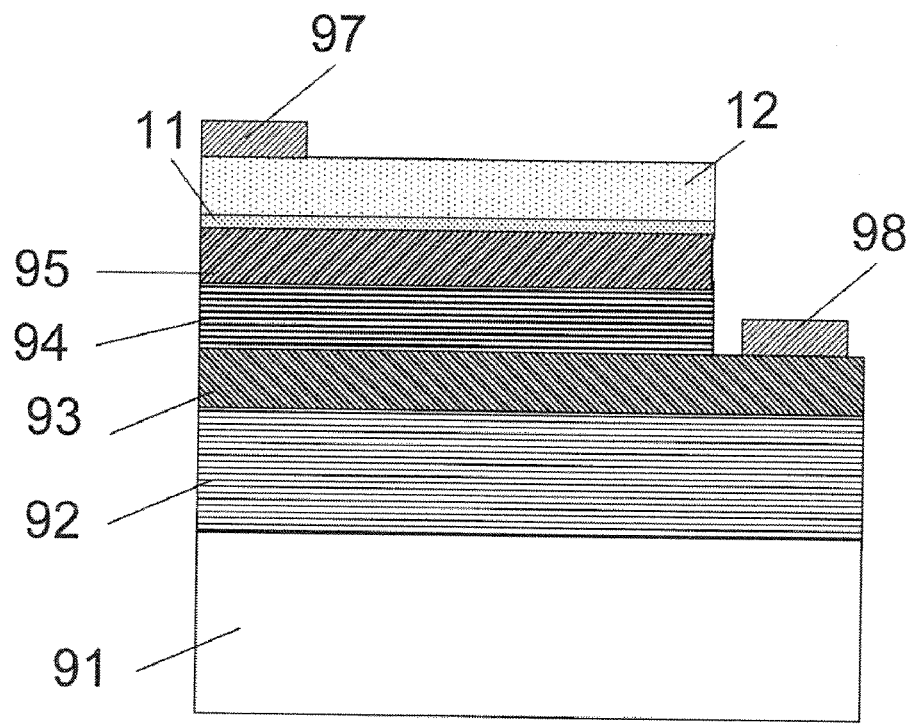
FIG. 3B shows an exemplary cross-sectional view of the fabricating method of the light-emitting diode according to embodiment 1.

As shown in FIG. 3A, until the surface of the n-type GaN cladding layer 93 is exposed, parts of the multi-quantum well layer 94 to the n-type single-crystalline ZnO transparent electrode film 12 are removed by dry-etching. Then, as shown in FIG. 3B, the p-side electrode 97 and the n-side electrode 98 are formed by a lift-off method on the single-crystalline ZnO transparent electrode film 12 and the n-type GaN cladding layer 93, respectively.

According to the embodiment 1, the n-type single-crystalline ITO transparent electrode film 11 is formed on the p-type GaN cladding layer 95. Furthermore, the n-type single-crystalline ZnO transparent electrode film 12 having an identical orientation to that of GaN is grown on the n-type single-crystalline ITO transparent electrode film 11.

Unlike a polycrystalline window electrode layer, in the single-crystalline window electrode layer, since the scattering of the output light due to the crystal grain boundaries does not occur, the efficiency of the light extraction is improved. Furthermore, the n-type single-crystalline ITO transparent electrode film 11 has much lower contact resistance with regard to the p-type GaN cladding layer 95, compared with the polycrystalline ITO.

Example 1

The following example describes the present invention in more detail.

First, the buffer layer 92 consisting of GaN with a thickness of 2 micrometers was grown on the sapphire substrate 91 by an MOCVD method.

The Si-doped n-type GaN cladding layer 93 was grown on the buffer layer 92.

The alternate growth of $In_xGa_{1-x}N$ and GaN was repeated five times to grow the multi-quantum well layer 94 on the n-type GaN cladding layer 93. Since it is preferable that x is not less than 0.01 and not more than 0.20, x was set to be 0.12 in the example 1. The number of times of the sequential growth of $In_xGa_{1-x}N$ and GaN for growing the multi-quantum well layer 94 may be not less than one and not more than ten.

The Mg-doped p-type GaN cladding layer 95 was grown on the multi-quantum well layer 94. Subsequently, the dopant was activated by annealing in a nitrogen atmosphere at a temperature of 800 degree Celsius for 30 minutes.

The carrier concentration of the p-type GaN measured by the Van der Pauw method was $1.9 \times 10^{-17}$ cm$^{-3}$. The present inventors confirmed that the carrier type was p-type.

The sapphire substrate 91 was set in a chamber with a vacuum degree of $2 \times 10^{-4}$ Pa. The temperature of the sapphire substrate 91 was increased to 250 degree Celsius. An ITO film containing Ga was grown by a PLD method. Hereinafter, the ITO film containing Ga is referred to as "GITO film".

Oxygen gas was introduced to the chamber. The partial pressure of the oxygen gas was set to be $2 \times 10^{-1}$ Pa.

The temperature of the sapphire substrate 91 was increased to 400 degree Celsius. An n-type ZnO film doped with 2 atom % of Ga (hereinafter, referred to as "ZnO film") was grown. The phrase "ZnO doped with 2 atom % of Ga" means ZnO having a molar ratio of Ga/(Ga+Zn) of 0.02.

The crystal growth condition of the ITO film and the ZnO film during the film formation was monitored with the Reflective High-Energy Electron Diffraction device fixed to the chamber for in-situ observation. Hereinafter, the term "Reflective High-Energy Electron Diffraction" is referred to as "RHEED".

[Discussion of the Molar Ratio of Ga/(Ga+In) in the Single-Crystalline ITO Transparent Electrode Film 11]

First, the present inventors monitored the crystal growth condition of the GITO film and the crystal growth condition of the ZnO film grown on the GITO film. In the observation, the additive amount of Ga contained in the GITO film was varied.

Table 1 shows the crystal growth condition of the GITO films (thickness: 1.1 nanometers) having the molar ratios of Ga/(In+Ga) of 0, 0.08, 0.3, and 0.5, and the crystal growth condition of the ZnO films having a thickness of 100 nanometers grown on each of the GITO film. The crystal growth conditions were obtained with use of the RHEED device by in-situ observation.

TABLE 1

Thickness of the GITO film: 1.1 nm

Figure 4A:
FIG. 4A is an RHEED photograph showing the result of the Reflective High-Energy Electron Diffraction.
Figure 4B:
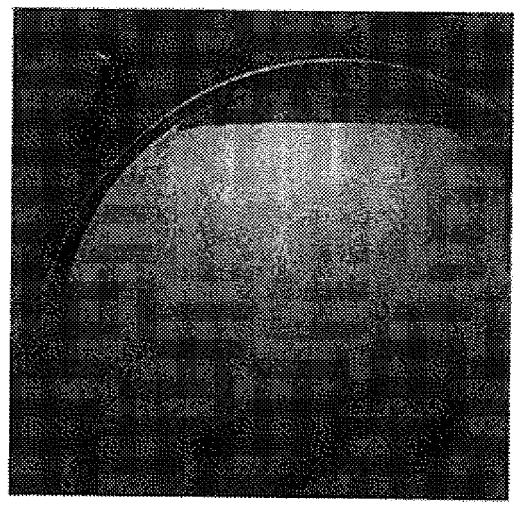
FIG. 4B is an RHEED photograph showing the result of the Reflective High-Energy Electron Diffraction.
Figure 4C:
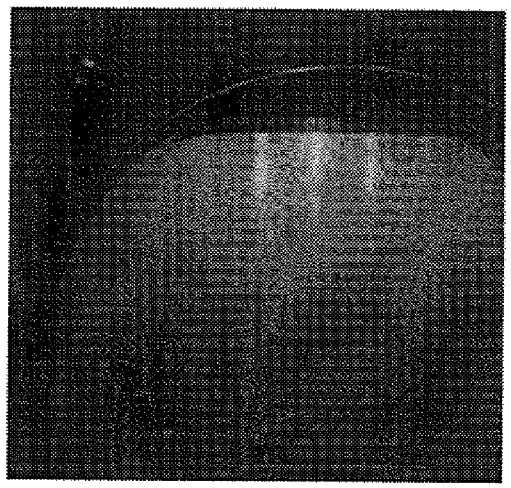
FIG. 4C is an RHEED photograph showing the result of the Reflective High-Energy Electron Diffraction.
Figure 4D:
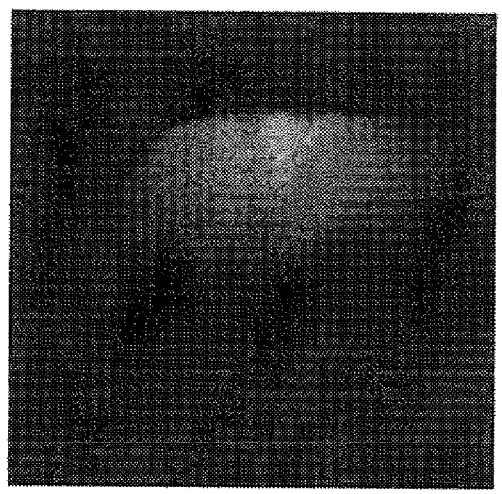
FIG. 4D is an RHEED photograph showing the result of the Reflective High-Energy Electron Diffraction.

| A molar ratio of Ga/(Ga + In) | RHEED photograph during growth | Crystallinity of ZnO/GITO |
|---|---|---|
| 0 (ITO) | FIG. 4A | polycrystalline |
| 0.08 | FIG. 4B | single-crystalline |
| 0.3 | FIG. 4C | single-crystalline |
| 0.5 ((Ga, In)$_2$SnO$_5$) | FIG. 4D | single-crystalline |

In a case where the ZnO film was grown on the ITO film which did not contain Ga (Namely, Ga/(Ga+In)=0), as shown in FIG. 4A, the RHEED shows a pattern where dark spots and rings were mixed. This means that a polycrystalline ITO film and polycrystalline ZnO film were grown.

On the contrary, in a case where the GITO film having a molar ratio of Ga/(Ga+In) of 0.08 and the ZnO film thereon were grown, as shown in FIG. 4B, the RHEED shows a clear streak pattern. This means that a single-crystalline GITO film and a single-crystalline ZnO film were grown both of which have an epitaxial orientation relationship. Presumably, since the GITO film has a different crystal system from that of the ITO film, which do not contain Ga, ZnO was grown epitaxially on the GITO film easily.

In a case where the GITO film having a molar ratio of Ga/(Ga+In) of 0.3 or 0.5 and the ZnO film thereon were grown, as shown in FIG. 4C and FIG. 4D, The RHEED shows a streak pattern. This means that a single-crystalline GITO film having an epitaxial orientation relationship and a single-crystalline ZnO film were grown.

However, the increase of an additive amount of Ga causes the pattern intensity of the RHEED to be lowered to deteriorate the crystallinity thereof in some degree. The GITO film having the molar ratio of Ga/(Ga+In) of 0.08 allowed the single-crystalline ZnO film having the most excellent crystallinity to be grown.

As understood from Table 1 and FIG. 4, it is necessary that the molar ratio of Ga/(Ga+In) in the n-type single-crystalline ITO transparent electrode film 11 is not less than 0.08 and not more than 0.5.

(Discussion of the Thickness of the n-Type Single-Crystalline ITO Transparent Electrode Film 11)

Next, the present inventors observed that the crystal growth conditions of a plurality of the GITO films having different thickness and the crystal growth conditions of the ZnO films formed thereon.

Table 2 shows the crystal growth condition of the GITO films having 0 nanometer, 1.1 nanometers, 11 nanometers, 55 nanometers, and 111 nanometers and the crystal growth condition of the ZnO films having a thickness of 100 nanometers formed thereof. The GITO films had a molar ratio of Ga/(Ga+In) of 0.08. The crystal growth condition was monitored with use of the RHEED device by using in-situ observation technique.

TABLE 2

Thickness of the GITO film: 1.1 nm

Figure 5A:
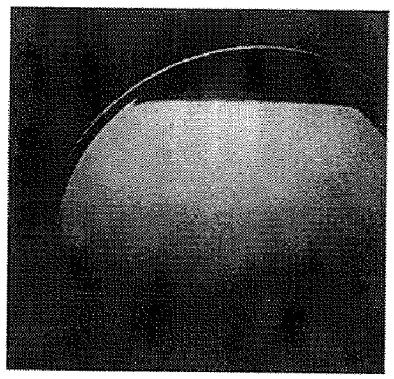
FIG. 5A is an RHEED photograph showing the result of the Reflective High-Energy Electron Diffraction.
Figure 5B:
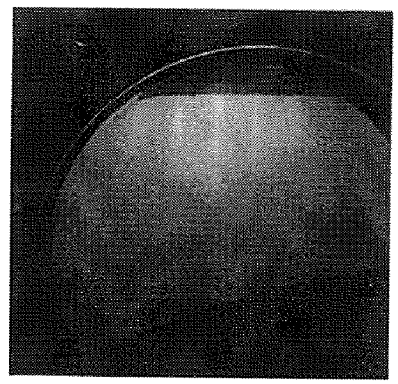
FIG. 5B is an RHEED photograph showing the result of the Reflective High-Energy Electron Diffraction.
Figure 5C:
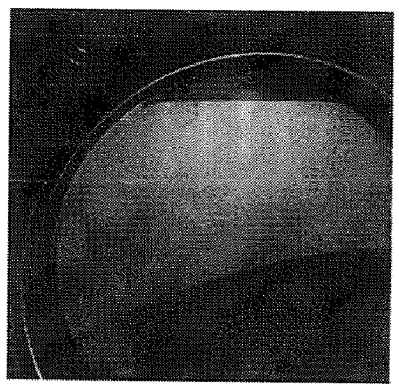
FIG. 5C is an RHEED photograph showing the result of the Reflective High-Energy Electron Diffraction.
Figure 5D:
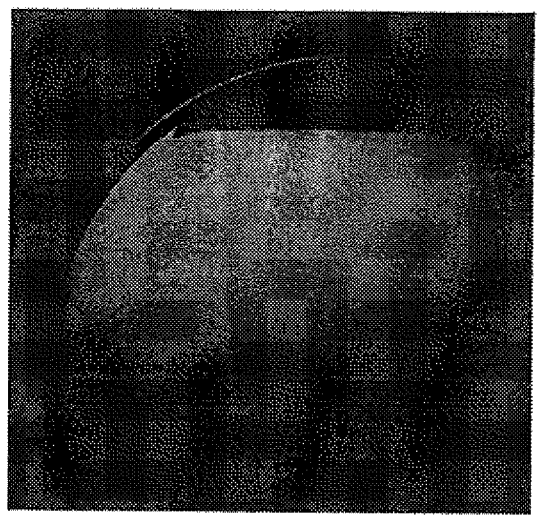
FIG. 5D is an RHEED photograph showing the result of the Reflective High-Energy Electron Diffraction.
Figure 5E:
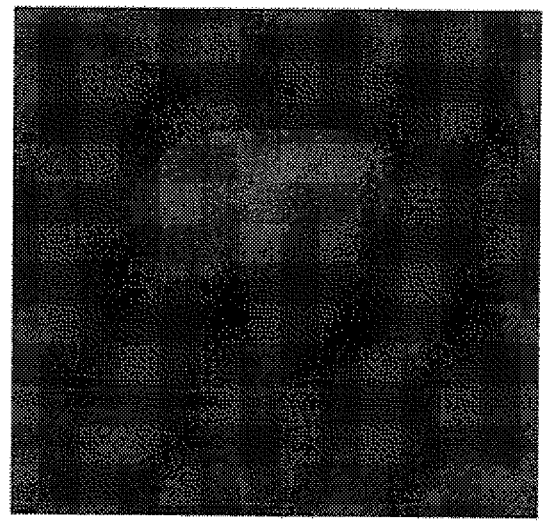
FIG. 5E is an RHEED photograph showing the result of the Reflective High-Energy Electron Diffraction.

| The thickness of GITO | RHEED photograph during growth | Crystallinity of ZnO/GITO |
| --- | --- | --- |
| 0 | FIG. 5A | single-crystalline |
| 1.1 nanometers | FIG. 5B | single-crystalline |
| 11 nanometers | FIG. 5C | single-crystalline |
| 55 nanometers | FIG. 5D | single-crystalline |
| 111 nanometers | FIG. 5E | Polycrystalline |

As shown in FIG. 5A, the RHEED of the ZnO film grown on GaN without the GITO film showed the clear streak pattern. This means that a single-crystalline ZnO film was grown.

As shown in FIG. 5B, FIG. 5C, and FIG. 5D, the RHEEDs of the ZnO films grown on the GITO films having a thickness of 1.1 nanometers, 11 nanometers, and 55 nanometers showed the clear streak pattern, respectively. All of these results mean that single-crystalline ZnO films having an epitaxial orientation relationship with GITO film were grown.

The increase of the thickness of the GITO film causes the intensity of the RHEED pattern to be lowered indicating deterioration of the crystallinity. As shown in FIG. 8E, the RHEED of the GITO film having 111 nanometers was a pattern having dark spots. This means that a polycrystalline GITO film was grown.

As understood from Table 1, Table 2, FIG. 4, and FIG. 5, the GITO film having the molar ratio of Ga/(Ga+In) of not less than 0.08 and not more than 0.50 and having a thickness of 1.1 nanometers and 55 nanometers is single-crystalline, and the single-crystalline ZnO film is grown thereon.

Figure 6A:
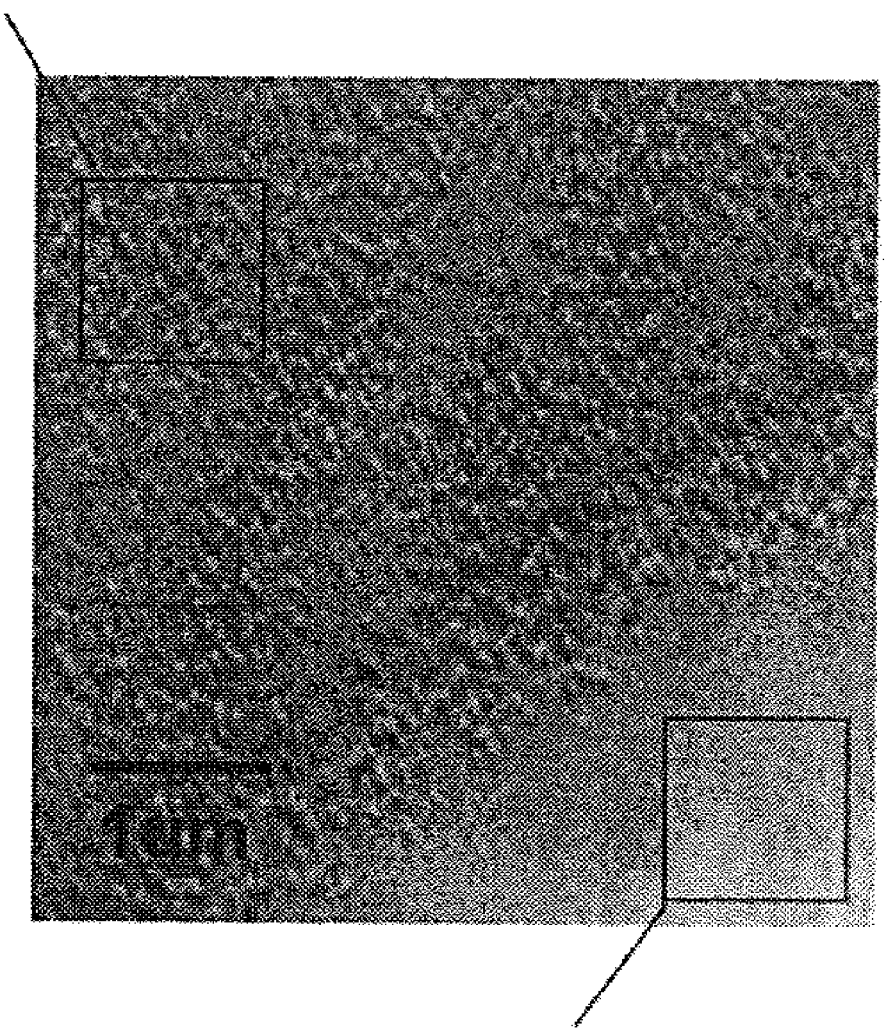
FIG. 6A is a SEM photograph in the example 1.
Figure 6B:
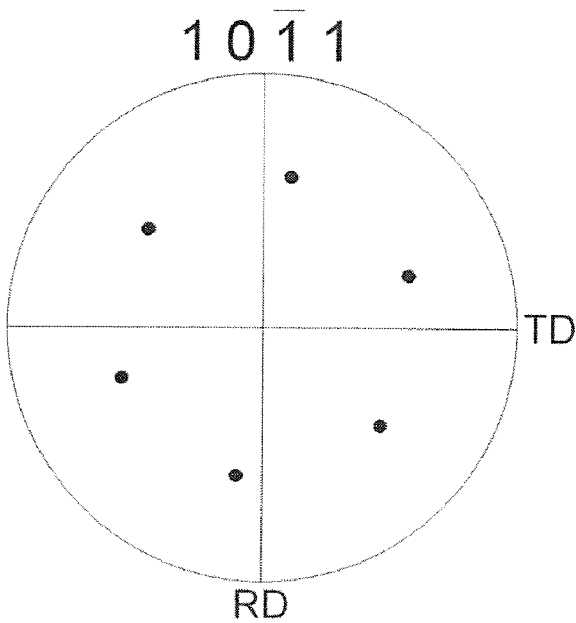
FIG. 6B is a pole figure from a (10-11) surface of the region 51 consisting of the ZnO film.
Figure 6C:
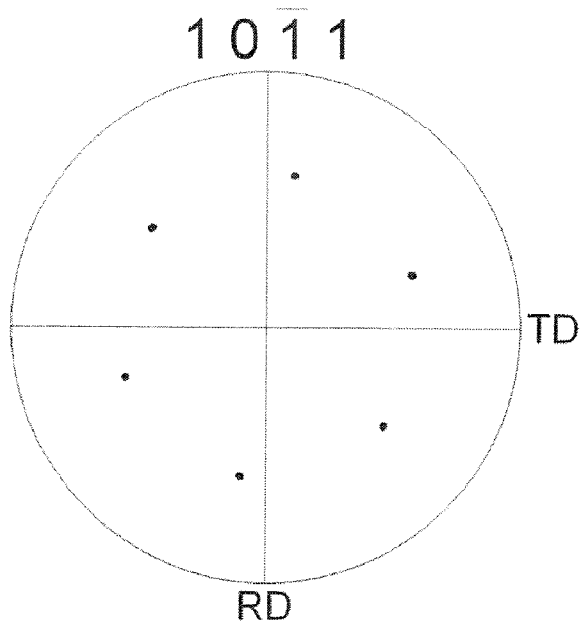
FIG. 6C is a pole figure from a (10-10) surface of the region 52 consisting of the GaN film.

FIG. 6A is a SEM image. Referential mark 51 in FIG. 6A indicates the region of the ZnO film having a thickness of 100 nanometers grown on the GITO film having a molar ratio of Ga/(Ga+In) of 0.08 and having a thickness of 1.1 nanometers. Referential mark 52 indicates the region of the GaN film exposed by removing the parts of the GITO film and the ZnO film by wet-etching method with use of hydrofluoric acid.

(Measurement of Contact Resistance)

The present inventors measured the contact resistance between the p-type GaN cladding layer 95 and singlecrystalline ITO transparent electrode film 11 by a Cycle-Trasmission Line Model.

TABLE 3

Ga/(Ga + In) ratio in GITO: 0.08

| Electrode structure | Contact resistance: $\rho_c$ (ohm/cm$^2$) |
| --- | --- |
| ZnO (100 nanometers) | 3.2E+4 |
| GITO (111 nanometers) | 6.4E−2 |
| ZnO (100 nanometers)/GITO (1.1 nanometers) | 7.9E−3 |

As understood from Table 3, the contact resistance of the ZnO film in contact with the p-type GaN cladding layer 93 was $3.2 \times 10^4$ ohm/cm$^2$, which was very high.

On the contrary, the contact resistance between the p-type GaN cladding layer 93 and the single-crystalline ZnO transparent electrode film 12 between which the GITO film having a molar ratio of Ga/(Ga+In) of 0.08 and a thickness of 111 nanometers was interposed was $6.4 \times 10^{-2}$ ohm/cm$^2$, which was low.

Further, the contact resistance between the p-type GaN cladding layer 93 and the single-crystalline ZnO transparent electrode film 12 between which the GITO film having a molar ratio of Ga/(Ga+In) of 0.08 and a thickness of 1.1 nanometers was interposed was $7.9 \times 10^{-3}$ ohm/cm$^2$, which was very low.

Figure 7:
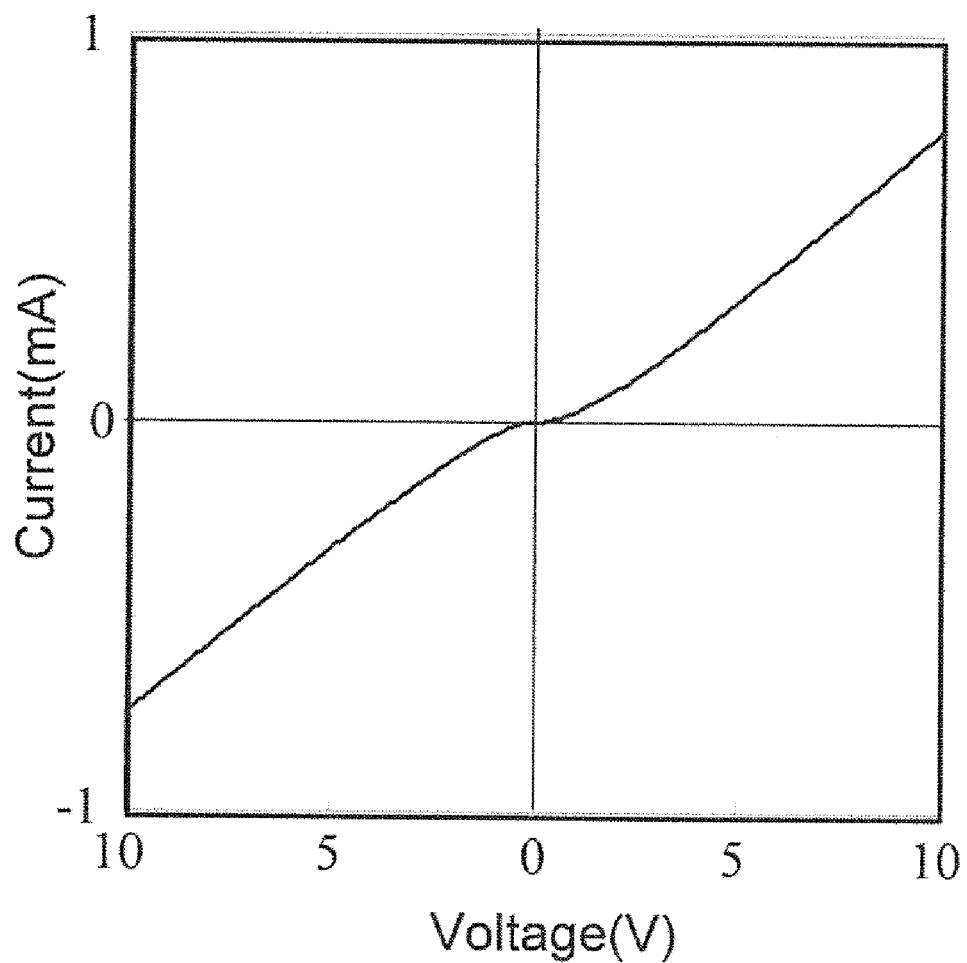
FIG. 7 shows the I-V curve of the light-emitting diode according to the example 1.

FIG. 7 shows the I-V curve of the light-emitting diode having the contact resistance of $7.9 \times 10^{-3}$ ohm/cm$^2$. As understood from FIG. 7, the I-V property having significantly excellent ohmic property was obtained.

(Measurement of the Light Transmissibility of the Window Electrode Layer)

The present inventors measured the transmittance of the window electrode layer.

Figure 8:
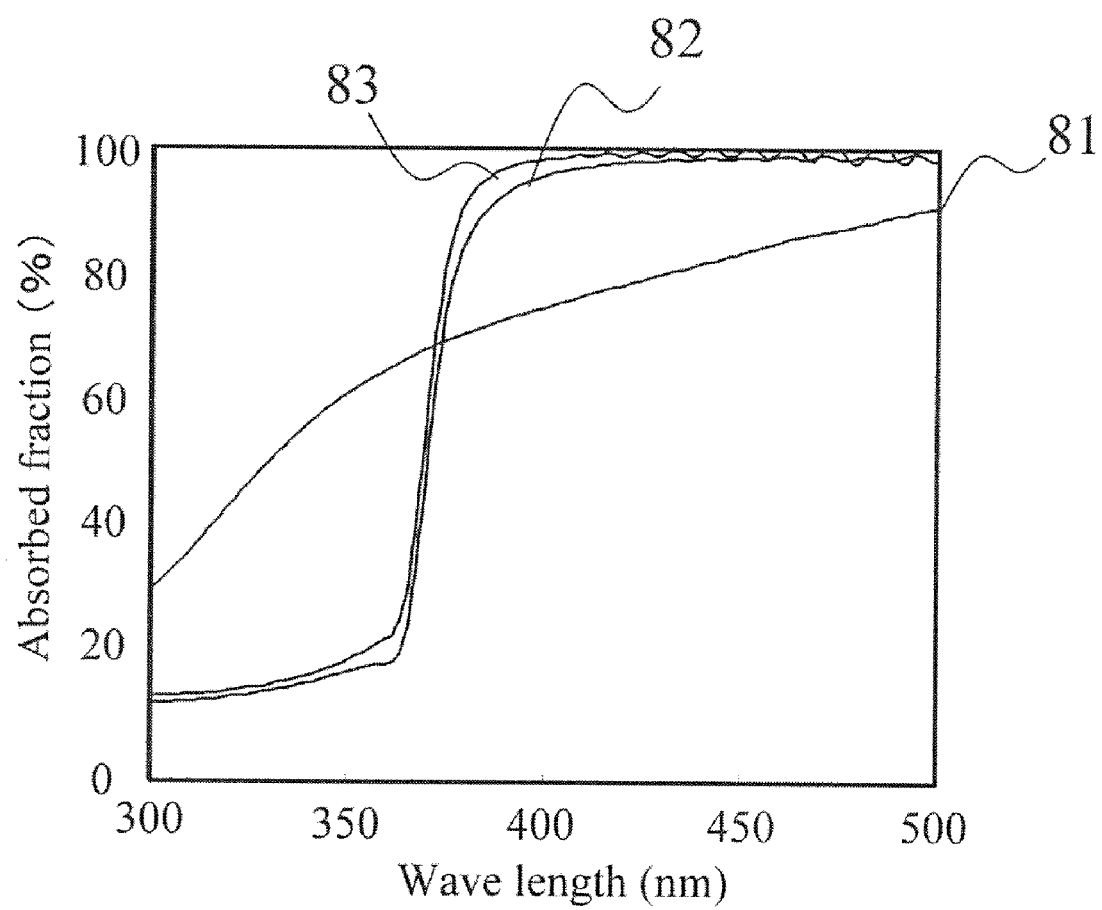
FIG. 8 shows the measurement result of the transmission spectrum with regard to a light with a wavelength of 300 to 500 nanometers.

FIG. 8 shows the measurement result of the transmission spectra with regard to a light having the wavelength of 300 nanometers to 500 nanometers.

Referential Mark 81 indicates the transmission spectrum of the polycrystalline GITO film having a molar ratio of Ga/(Ga+In) of 0.08 and having a thickness of 111 nanometers.

Referential Mark 82 indicates the transmission spectrum of the single-crystalline ZnO film having a thickness of 100 nanometers grown on the single-crystalline GITO film having a molar ratio of Ga/(Ga+In) of 0.08 and having a thickness of 1.1 nanometers.

Referential Mark 83 indicates the transmission spectrum of the single-crystalline ZnO film having a thickness of 100 nanometers.

Compared to the spectrum 81, the spectrum 82 shows a higher transmittance. The higher transmittance is similar to that of the spectrum 83 of the ZnO single layer structure. Accordingly, high efficiency of the light extraction from the inside of the light-emitting diode is expected.

Table 4 shows the light transmittance of the window electrode layers of the following (a) to (d).

(a): a single-crystalline ZnO/GITO bilayer composed of the GITO film having a molar ratio of Ga/(Ga+In) of 0.08 and having a thickness of 1.1 nanometers and the ZnO film having a thickness of 500 nanometers formed on the GITO film, (b): a Ni/Au bilayer composed of a Ni film having a thickness of 4 nanometers and an Au film having a thickness of 8 nanometers formed on the Ni film, (c): an ITO film having a thickness of 230 nanometers, and (d): a single-crystalline ZnO film having a thickness of 500 nanometers.

The light transmissibility was measured with use of an integrating sphere while the light-emitting diode was turned on by a predetermined operating voltage (approximately 3.5V).

TABLE 4

Ga/(Ga + In) ratio in GITO: 0.08

| Electrode structure | Light output (a.u.) |
|---|---|
| Ni (4 nanometers)/Au (8 nanometers) | 100 |
| ITO (230 nanometers) | 136 |
| ZnO (500 nanometers) | 43 |
| ZnO (500 nanometers)/GITO (1.1 nanometers) | 154 |

As understood from Table 4, compared to the Ni/Au bilayer, the ITO film has 1.36 times light output. However, the single-crystalline ZnO film has no more than 0.43 times light output, compared to the Ni/Au bilayer. The singlecrystalline ZnO/GITO bilayer has 1.54 times light output, compared to the Ni/Au bilayer.

As understood from the example, the window electrode layer composed of the single-crystalline GITO transparent electrode film having a molar ratio of Ga/(Ga+In) of not less than 0.08 and not more than 0.5 and having a thickness of not less than 1.1 nanometers and not more than 55 nanometers and the single-crystalline ZnO film grown on the single-crystalline GITO transparent electrode film achieved the low contact resistance and high light output at the same time.

INDUSTRIAL APPLICABILITY

The light-emitting diode according to the present invention is built into an illuminating device or a display device.

REFERENCE SIGNS LISTS

11: n-type single-crystalline ITO transparent electrode film
12: n-type single-crystalline ZnO transparent electrode film
81: transmission spectrum of the polycrystalline GITO film having a molar ratio of Ga/(Ga+In) of 0.08 and having a thickness of
111 nanometers
82: transmission spectrum of the single-crystalline ZnO film having a thickness of 100 nanometers grown on the single-crystalline GITO film having a molar ratio of Ga/(Ga+In) of 0.08 and having a thickness of 1.1 nanometers
83: transmission spectrum of the single-crystalline ZnO film having a thickness of 100 nanometers
91: sapphire substrate
92: buffer layer
93: n-type GaN cladding layer
94: multi-quantum well layer
95: p-type GaN cladding layer
97: p-side electrode
98: n-side electrode

The invention claimed is:

1. A light-emitting diode, comprising:
an n-type nitride semiconductor layer;
a multiple quantum well;
a p-type nitride semiconductor layer;
a window electrode layer;
a p-side electrode; and
an n-side electrode, wherein:
the n-type nitride semiconductor layer, the multiple quantum well, the p-type nitride semiconductor layer, the window electrode layer, the p-side electrode, and the n-side electrode are stacked in this order,
the n-side electrode is electrically connected to the n-type nitride semiconductor layer,
the window electrode layer comprises an n-type single-crystalline ITO transparent film and an n-type single-crystalline ZnO transparent film,
the p-type nitride semiconductor layer is in contact with the n-type single-crystalline ITO transparent film,
the n-type single-crystalline ITO transparent film is contact with the n-type single-crystalline ZnO transparent film,
the p-side electrode is connected with the n-type single-crystalline ZnO transparent film,
the n-type single-crystalline ITO transparent film contains not only In but also Ga,
the n-type single-crystalline ITO transparent film has a molar ratio of Ga/(In +Ga) of not less than 0.08 and not more than 0.5, and
the n-type single-crystalline ITO transparent film has a thickness of not less than 1.1 nm and not more than 55 nm.

2. A method for emitting a light from a light-emitting diode, comprising the following step (a) and step (b),
a step (a) of preparing a light-emitting diode according to claim 1, and
a step (b) of applying a potential difference between the n-side electrode and the p-side electrode to emit a light from the light-emitting diode.

* * * * *